United States Patent
Maltenberger et al.

(10) Patent No.: US 9,929,362 B2
(45) Date of Patent: Mar. 27, 2018

(54) METAL COMPLEXES AS P-TYPE DOPANTS FOR ORGANIC ELECTRONIC MATRIX MATERIALS

(71) Applicants: SIEMENS AKTIENGESELLSCHAFT, Munich (DE); OSRAM OLED GmbH, Regensburg (DE)

(72) Inventors: Anna Maltenberger, Leutenbach (DE); Sébastien Pecqueur, La Couture (FR); Guenter Schmid, Hemhofen (DE); Jan Hauke Wemken, Nuremburg (DE)

(73) Assignees: SIEMENS AKTIENGESELLSCHAFT, Munich (DE); OSRAM OLED GMBH, Regensburg (DE)

( * ) Notice: Subject to any disclaimer, the term of this patent is extended or adjusted under 35 U.S.C. 154(b) by 240 days.

(21) Appl. No.: 14/406,307

(22) PCT Filed: May 14, 2013

(86) PCT No.: PCT/EP2013/059868
§ 371 (c)(1),
(2) Date: Dec. 8, 2014

(87) PCT Pub. No.: WO2013/182383
PCT Pub. Date: Dec. 12, 2013

(65) Prior Publication Data
US 2015/0162534 A1 Jun. 11, 2015

(30) Foreign Application Priority Data
Jun. 6, 2012 (DE) .................. 10 2012 209 520

(51) Int. Cl.
*H01L 51/42* (2006.01)
*H01L 51/00* (2006.01)
*H01L 51/50* (2006.01)

(52) U.S. Cl.
CPC .......... *H01L 51/009* (2013.01); *H01L 51/42* (2013.01); *H01L 51/506* (2013.01); *Y02E 10/549* (2013.01)

(58) Field of Classification Search
CPC ....... H01L 5/009; H01L 51/42; H01L 51/506; Y02E 10/549
(Continued)

(56) References Cited

U.S. PATENT DOCUMENTS

| 8,278,652 B2 | 10/2012 | Krause et al. ............... 257/40 |
| 8,513,702 B2 | 8/2013 | Schmid et al. ............. 257/157 |

(Continued)

FOREIGN PATENT DOCUMENTS

| CN | 101679459 A | 3/2010 | ............... C07F 5/06 |
| CN | 101785127 A | 7/2010 | ............. H01L 51/00 |

(Continued)

OTHER PUBLICATIONS

O.A. Adamenko et al., "Luminescence of salts and copolymers containing the $(Mo^{II}_6Cl_8)^{4+}$ cluster," Russian Chemical Bulletin, International Edition, vol. 51, No. 6, Jun. 2002, pp. 994-997.

(Continued)

*Primary Examiner* — Harold Pyon
*Assistant Examiner* — Danny N Kang
(74) *Attorney, Agent, or Firm* — Slayden Grubert Beard PLLC (57) ABSTRACT

A bi- or polynuclear metal complex of a metal of groups Vb/VIb/VIIb (IUPAC groups 5-7), has a ligand of the structure (a), wherein R1 and R2, independently of each other, can be oxygen, sulfur, selenium, NH, or NR4, wherein (Continued)

R4 is selected from alkyls and aryls and can be bonded to R3; and R3 is selected from alkyls, long-chain alkyls, alkoxys, long-chain alkoxys, cycloalkyls, haloalkyls, aryls, arylenes, haloaryls, heteroaryls, heteroarylenes, heterocycloalkylenes, heterocycloalkyls, haloheteroaryls, alkenyls, haloalkenyls, alkynyls, haloalkynyls, ketoaryls, haloketoaryls, ketoheteroaryls, ketoalkyls, haloketoalkyls, ketoalkenyls, haloketoalkenyls, where one or more non-adjacent CH2 groups can be replaced, independently, with (1) —O—, —S—, —NH—, —NR°—, —SiR°R°°—, —CO—, —COO—, —OCO—, —OCO—O—, —SO2-, —S—CO—, —CO—S—, —CY1=CY2, or —C≡O— in such a way that O and/or S atoms are not bonded directly to each other, or (2) aryls or heteroaryls containing 1 to 30 C atoms, as a p-type doping agent for matrix materials of electronic components.

15 Claims, 5 Drawing Sheets (58) Field of Classification Search
USPC .......................................................... 252/500
See application file for complete search history.

(56) References Cited

U.S. PATENT DOCUMENTS

| 8,846,212 | B2 | 9/2014 | Lee et al. ........................ 428/690 |
| 8,937,175 | B2 | 1/2015 | Kanitz et al. ................... 544/183 |
| 9,481,826 | B2 | 11/2016 | Stoessel et al. | |
| 2010/0308306 | A1 | 12/2010 | Schmid et al. ................. 257/40 |
| 2011/0037065 | A1* | 2/2011 | Ueno ...................... H01L 51/009 257/40 |
| 2011/0089408 | A1* | 4/2011 | Schmid ................... C07F 1/005 257/40 |
| 2013/0200353 | A1 | 8/2013 | Schmid et al. | |

FOREIGN PATENT DOCUMENTS

| CN | 102057014 A | 5/2011 | ............. C09K 11/06 |
| DE | 102010041331 | 3/2012 | |
| DE | 102012209520.9 | 6/2012 | |
| EP | 2276086 | 1/2011 | |
| JP | 2010530618 A | 9/2010 | ............. H01L 51/50 |
| JP | 2010530626 A | 9/2010 | ............ H01L 29/861 |
| JP | 2011134895 A | 7/2011 | ............. H01L 51/50 |
| WO | 2005/086251 | 9/2005 | |
| WO | 2011/033023 | 3/2011 | |
| WO | 2011/157546 A1 | 12/2011 | ........... C07D 253/08 |
| WO | PCT/EP2013/059868 | 5/2013 | |

OTHER PUBLICATIONS

Kaplan Kirakci et al., "A Highly Luminescent Hexanuclear Molybdenum Cluster—A Promising Candidate toward Photoactive Materials," European Journal of Inorganic Chemistry, 2012, pp. 3107-3111.

Jun Endo et al., "Organic Electroluminescent Devices with a Vacuum-Deposited Lewis-Acid-Doped Hole-Injecting Layer," Japanese Journal of Applied Physics, vol. 41, Part 2, No. 3B, Mar. 2002, 2 pages.

German Office Action for German Priority Patent Application No. 10 2012 209 520.9, issued Mar. 28, 2013, 5 pages.

English language International Search Report for PCT/EP2013/059868, dated Aug. 16, 2013, 2 pages.

* cited by examiner

METAL COMPLEXES AS P-TYPE DOPANTS FOR ORGANIC ELECTRONIC MATRIX MATERIALS

CROSS REFERENCE TO RELATED APPLICATIONS

This application is based on and hereby claims priority to International Application No. PCT/EP2013/059868 filed on May 14, 2013 and German Application No. 10 2012 209 520.9 filed on Jun. 6, 2012, the contents of which are hereby incorporated by reference.

BACKGROUND

Described below are bi- or polynuclear metal complexes as p-dopants for organic electronic matrix materials.

Figure 1:
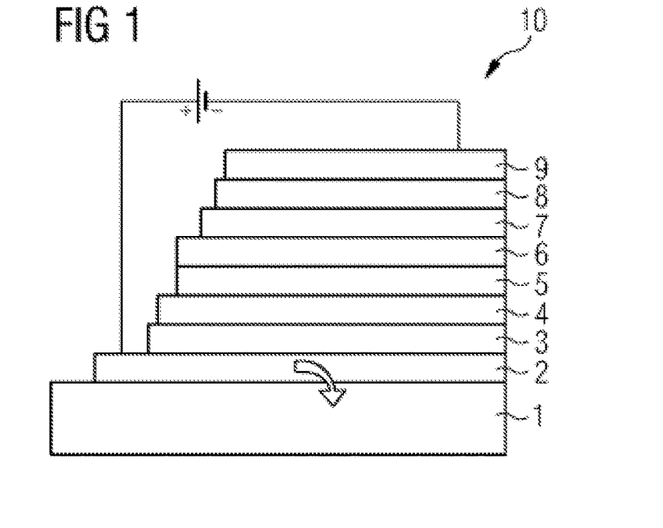
FIG. 1 is a schematic side-view of the structure of an organic light-emitting diode (10). The light-emitting diode is formed from a glass layer (1); transparent conductive oxide (TCO) or PEDOT:PSS or PANI layer (2); hole injector layer (3); hole transport layer (HTL) (4); emitter layer (EML) (5); hole blocker layer (HBL) (6); electron transport layer (ETL) (7); electron injector layer (8) and a cathode layer (9)
Figure 2:
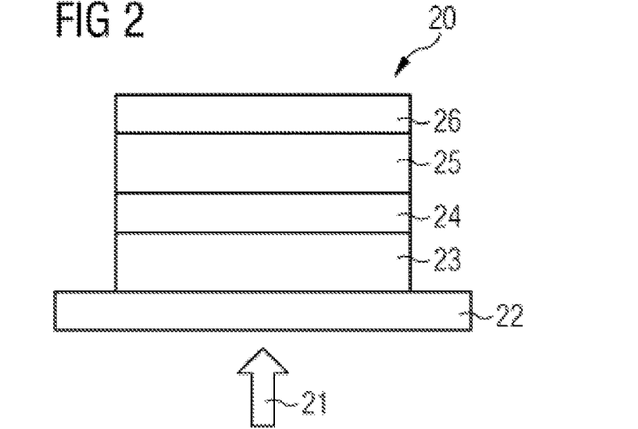
FIG. 2 is a schematic side view of the structure of an organic solar cell having PIN structure (20), which converts light (21) to electrical current. The solar cell is formed of a layer of indium tin oxide (22); a p-doped layer (23); an absorption layer (24); an n-doped layer (25) and a metal layer (26)
Figure 3:
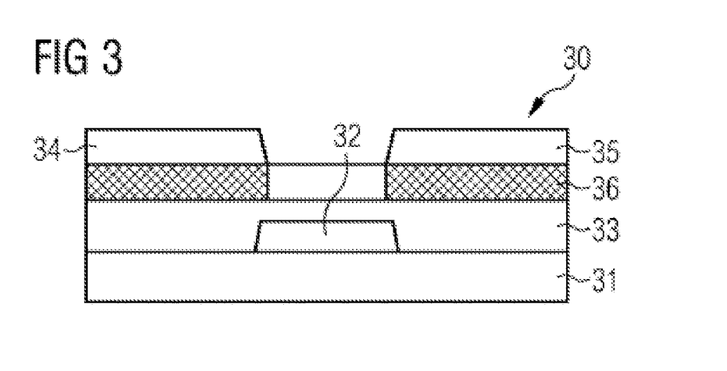
FIG. 3 is a schematic cross section of an organic field-effect transistor (30). Atop a substrate (31) is applied a gate electrode (32), a gate dielectric (33), a source and drain contact (34+35) and an organic semiconductor (36). The hatched areas show the points where contact doping is helpful.

Within organic electronics, it is possible to identify two important commercial fields of technology. The first field of technology is concerned with uses of organic matrix materials for conversion of light to electrical current and vice versa, and the other field is focused on the construction of electrical components by organic semiconductor material. Examples of the former category are, for example, photodetectors and organic solar cells, shown in schematic form in FIG. 1, which convert light to an electrical signal or to electrical current, and organic light-emitting diodes (OLEDs), which can generate light by organic electronic materials (see FIG. 2). In the second field of technology are, for example, organic field-effect transistors, shown in schematic form in FIG. 3, in which doping reduces the contact resistance between electrode and semiconductor material, or bipolar transistors.

A common factor to all the applications is that they include, as important functional component, electrical transport layers which have different conduction mechanisms depending on their composition. In general, a distinction is made between intrinsic p-conductivity (hole conductivity) and n-conductivity (electron conductivity) of the organic materials. Since the electrical properties of these organic substance classes are generally insufficient for high-efficiency utilization of the components, they are admixed with additional compounds which are intended to improve the electrical properties of the layers. This is typically done by doping with metallic or further organic compounds. One approach to achieving significant improvements in conductivities is the addition of metal complexes and especially the addition of transition metal complexes.

For example, WO 2005 086251 describes dopants for production of n-conductive layers which may have structures including the following:

The structure of this compound class is also referred to in the literature as "paddle wheel complex". More particularly, the publication describes the use of a metal complex as n-dopant for doping an organic semiconductive matrix material to alter the electrical properties thereof. The compounds presented are said, with respect to the matrix material, to be usable as n-dopants.

Another way of using Lewis-acidic metal complexes to dope p-conductive transport layers is given by Endo et al. (Jpn. J. Appl. Phys. vol. 41 (2002) L358-L360). This reference describes organic electroluminescent devices having a p-conductive layer which are prepared by co-doping from $FeCl_3$ and arylamine derivatives, for example N,N'-dinaphthyl-N,N-diphenylbenzidine (α-NPD). However, significant disadvantages for the component are also described therein, such as extinguishment of the luminescence and an increase in intrinsic absorption.

A further way of configuring organic semiconductors for bipolar field-effect transistors by doping is additionally disclosed in DE 102010041331.

SUMMARY

One potential object is finding further materials which are suitable as p-dopants in organic electronic matrix materials, especially hole transporters, and increase the efficiency of components containing these layers.

Accordingly, an organic electronic component having a matrix is proposed, wherein the matrix contains, as p-dopant, a bi- or polynuclear group Vb/VIb/VIIb or group 5-7 metal complex which in turn contains at least one ligand L of the following structure:

where $R^1$ and $R^2$ are each independently oxygen, sulfur, selenium, NH or $NR^4$ where $R^4$ is selected from the group comprising alkyl and aryl and may be bonded to $R^3$; and $R^3$ is selected from the group comprising alkyl, long-chain alkyl, alkoxy, long-chain alkoxy, cycloalkyl, haloalkyl, aryl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl, where one or more non-adjacent $CH_2$ groups in suitable radicals may independently be replaced by —O—, —S—, —NH—, —NR°—, —SiR°R°°—, —CO—, —COO—, —OCO—, —OCO—O—, —$SO_2$—, —S—CO—, —CO—S—, —CY1=CY2, or —C≡O—, in such a way that no oxygen and/or sulfur atoms are bonded directly to one another, and are likewise optionally replaced by aryl or heteroaryl preferably containing 1 to 30 carbon atoms (terminal $CH_3$ groups are regarded as $CH_2$ groups in the sense of $CH_2$—H).

It has been found that, surprisingly, these materials are suitable as p-dopants for matrix materials in organic electronic components. More particularly, these materials often have one or more of the following advantages:

- The materials have good co-evaporability with the matrix material together from two separate sources, such that doped matrix layers of defined composition form.
- The materials are obtainable in a simple way and do not require any complex preparation processes.
- The doping strength can be adapted to the matrix.
- The conductivity can be adjusted via the concentration and type of substance.

It has also been found that, surprisingly, these materials, in the case that they are employed for n-doping of electron transport layers, lead to blocking of the electron conductivity of the layer and not to an increase in electron conductivity, as described in the related art.

In the context of this discussion, the term "organic electronic component" means and/or encompasses especially organic transistors, organic light-emitting diodes, light-emitting electrochemical cells, organic solar cells, photodiodes and organic photovoltaics in general.

In the context of this discussion, the term "p-dopant" means or encompasses especially materials which have Lewis acidity and/or are capable of forming complexes with the matrix material in which these materials act as Lewis acids (if only in a formal sense).

Such a metal complex matrix material (hole conductor) may have, for example, the following structure (see also Example I):

The term "Vb/VIb/VIIb or group 5-7 metal" is understood to mean the metals of groups 5 to 7 according to IUPAC (according to the old designation group Vb/VIB/VIIb), i.e. vanadium, niobium, tantalum (group 5), chromium, molybdenum, tungsten (group 6), manganese, technetium, rhenium (group 7) or mixtures thereof. Preference is given to the metals of group 6, i.e. chromium, molybdenum, tungsten, more preferably chromium and molybdenum.

The term "bi- or polynuclear" is especially understood to mean that the complex contains more than one of the above-specified metals. Preference is given here to an interaction between the metal atoms in the form of a metal-metal interaction, or a metal-metal single bond or a metal-metal multiple bond.

General group definitions: general groups, for example alkyl, alkoxy, aryl etc., are described. Unless stated otherwise, preference is given in the context of this discussion to using the groups which follow within the groups described in general terms:
alkyl: linear and branched C1-C8-alkyls,
long-chain alkyls: linear and branched C5-C20 alkyls
alkenyl: C2-C6-alkenyl,
cycloalkyl: C3-C8-cycloalkyl,
alkoxy: C1-C6-alkoxy,
long-chain alkoxy: linear and branched C5-C20 alkoxy
alkylene: selected from the group comprising: methylene; 1,1-ethylene; 1,2-ethylene; 1,1-propylidene; 1,2-propylene; 1,3-propylene; 2,2-propylidene; butan-2-ol-1,4-diyl; propan-2-ol-1,3-diyl; 1,4-butylene; cyclohexane-1,1-diyl; cyclohexane-1,2-diyl; cyclohexane-1,3-diyl; cyclohexane-1,4-diyl; cyclopentane-1,1-diyl; cyclopentane-1,2-diyl; and cyclopentane-1,3-diyl, aryl: selected from aromatics having a molecular weight below 300 Da.
arylene: selected from the group comprising: 1,2-phenylene; 1,3-phenylene; 1,4-phenylene; 1,2-naphthylene; 1,3-naphthalenylene; 1,4-naphthylene; 2,3-naphthylene; 1-hydroxy-2,3-phenylene; 1-hydroxy-2,4-phenylene; 1-hydroxy-2,5-phenylene; and 1-hydroxy-2,6-phenylene,
heteroaryl: selected from the group comprising: pyridinyl; pyrimidinyl; pyrazinyl; triazolyl; pyridazinyl; 1,3,5-triazinyl; quinoninyl; isoquinoninyl; quinoxalinyl; imidazolyl; pyrazolyl; benzimidazolyl; thiazolyl; oxazolidinyl; pyrrolyl; thiophenyl; carbazolyl; indolyl; and isoindolyl, where the heteroaryl may be bonded to the compound via any atom in the ring of the selected heteroaryl.
heteroarylene: selected from the group comprising: pyridinediyl; quinolinediyl; pyrazodiyl; pyrazolediyl; triazolediyl; pyrazinediyl; thiophenediyl; and imidazolediyl, where the heteroarylene functions as a bridge in the compound via any atom in the ring of the selected heteroaryl, the following being especially preferred: pyridine-2,3-diyl; pyridine-2,4-diyl; pyridine-2,5-diyl; pyridine-2,6-diyl; pyridine-3,4-diyl; pyridine-3,5-diyl; quinoline-2,3-diyl; quinoline-2,4-diyl; quinoline-2,8-diyl; isoquinoline-1,3-diyl; isoquinoline-1,4-diyl; pyrazole-1,3-diyl; pyrazole-3,5-diyl; triazole-3,5-diyl; triazole-1,3-diyl; pyrazine-2,5-diyl; and imidazole-2,4-diyl, thiophene-2,5-diyl, thiophene-3,5-diyl; a-C1-C6-heterocycloalkyl selected from the group comprising: piperidinyl; piperidine; 1,4-piperazine, tetrahydrothiophene; tetrahydrofuran; 1,4,7-triazacyclononane; 1,4,8,11-tetraazacyclotetradecane; 1,4,7,10,13-pentaazacyclopentadecane; 1,4-diaza-7-thiacyclononane; 1,4-diaza-7-oxacyclononane; 1,4,7,10-tetraazacyclododecane; 1,4-dioxane; 1,4,7-trithiacyclononane; pyrrolidine; and tetrahydropyran, where the heteroaryl may be bonded to the C1-C6-alkyl via any atom in the ring of the selected heteroaryl.
heterocycloalkylene: selected from the group comprising: piperidin-1,2-ylene; piperidin-2,6-ylene; piperidin-4,4-ylidene; 1,4-piperazin-1,4-ylene; 1,4-piperazin-2,3-ylene; 1,4-piperazin-2,5-ylene; 1,4-piperazin-2,6-ylene; 1,4-piperazin-1,2-ylene; 1,4-piperazin-1,3-ylene; 1,4-piperazin-1,4-ylene; tetrahydrothiophen-2,5-ylene; tetrahydrothiophen-3,4-ylene; tetrahydrothiophen-2,3-ylene; tetrahydrofuran-2,5-ylene; tetrahydrofuran-3,4-ylene; tetrahydrofuran-2,3-ylene; pyrrolidin-2,5-ylene; pyrrolidin-3,4-ylene; pyrrolidin-2,3-ylene; pyrrolidin-1,2-ylene; pyrrolidin-1,3-ylene; pyrrolidin-2,2-ylidene; 1,4,7-triazacyclonon-1,4-ylene; 1,4,7-triazacyclonon-2,3-ylene; 1,4,7-triazacyclonon-2,9-ylene; 1,4,7-triazacyclonon-3,8-ylene; 1,4,7-triazacyclonon-2,2-ylidene;

1,4,8,11-tetraazacyclotetradec-1,4-ylene; 1,4,8,11-tetraazacyclotetradec-1,8-ylene; 1,4,8,11-tetraazacyclo-tetradec-2,3-ylene; 1,4,8,11-tetraazacyclotetradec-2,5-ylene; 1,4,8,11-tetraazacyclotetradec-1,2-ylene; 1,4,8,11-tetraazacyclotetradec-2,2-ylidene; 1,4,7,10-tetraazacyclododec-1,4-ylene; 1,4,7,10-tetraazacyclododec-1,7-ylene; 1,4,7,10-tetraazacyclododec-1,2-ylene; 1,4,7,10-tetraazacyclododec-2,3-ylene; 1,4,7,10-tetraazacyclododec-2,2-ylidene; 1,4,7,10,13-pentaazacyclopentadec-1,4-ylene; 1,4,7,10,13-pentaazacyclopentadec-1,7-ylene; 1,4,7,10,13-pentaazacyclopentadec-2,3-ylene; 1,4,7,10,13-pentaazacyclo-pentadec-1,2-ylene; 1,4,7,10,13-pentaazacyclopentadec-2,2-ylidene; 1,4-diaza-7-thiacyclonon-1,4-ylene; 1,4-diaza-7-thia-cyclonon-1,2-ylene; 1,4-diaza-7-thiacyclonon-2,3-ylene; 1,4-diaza-7-thiacyclonon-6,8-ylene; 1,4-diaza-7-thiacyclonon-2,2-ylidene; 1,4-diaza-7-oxacyclonon-1,4-ylene; 1,4-diaza-7-oxa-cyclonon-1,2-ylene; 1,4-diaza-7-oxacyclonon-2,3-ylene; 1,4-diaza-7-oxacyclonon-6,8-ylene; 1,4-diaza-7-oxacyclonon-2,2-ylidene; 1,4-dioxan-2,3-ylene; 1,4-dioxan-2,6-ylene; 1,4-dioxan-2,2-ylidene; tetrahydropyran-2,3-ylene; tetrahydropyran-2,6-ylene; tetra-hydropyran-2,5-ylene; tetrahydropyran-2,2-ylidene; 1,4,7-trithiacyclonon-2,3-ylene; 1,4,7-trithia-cyclonon-2,9-ylene; and 1,4,7-trithiacyclonon-2,2-ylidene, heterocycloalkyl: selected from the group comprising: pyrrolinyl; pyrrolidinyl; morpholinyl; piperidinyl; piperazinyl; hexamethyleneimine; 1,4-piperazinyl; tetrahydrothiophenyl; tetrahydrofuranyl; 1,4,7-triazacyclononanyl; 1,4,8,11-tetraazacyclotetradecanyl; 1,4,7,10,13-pentaazacyclopentadecanyl; 1,4-diaza-7-thiacyclo-nonanyl; 1,4-diaza-7-oxacyclononanyl; 1,4,7,10-tetraazacyclododecanyl; 1,4-dioxanyl; 1,4,7-trithiacyclo-nonanyl; tetrahydropyranyl; and oxazolidinyl, where the heterocycloalkyl may be bonded to the compound via any atom in the ring of the selected heterocycloalkyl.

amine: the —N(R)2 group where each R is selected independently from: hydrogen; C1-C6-alkyl; C1-C6-alkyl-C6H5; and phenyl, where, when both R' are C1-C6 alkyl, the two R' may form an —NC3 to NC5 heterocyclic ring, where the rest of the alkyl chain forms an alkyl substituent on the heterocyclic ring halogen: selected from the group comprising: F; Cl; Br and I haloalkyl: selected from the group comprising mono-, di-, tri-, poly- and perhalogenated linear and branched C1-C8-alkyl, especially —CF$_3$.

pseudohalogen: selected from the group comprising —CN, —SCN, —OCN, N3, —CNO and —SeCN.

carboxylate: the —C(O)OR group where R is selected from: hydrogen; C1-C6-alkyl; phenyl; C1-C6-alkyl-C6H5;

carbonyl: the —C(O)R group where R is selected from: hydrogen; Cl-C6-alkyl; phenyl; C1-C6-alkyl-C6H5 and amines selected from the group of: —NR'2 where each R' is independently selected from: hydrogen; Cl-C6-alkyl; C1-C6-alkyl-C6H5; and phenyl, where, when both R' are C1-C6 alkyl, the two R' may form an —NC3 to NC5 heterocyclic ring, where the rest of the alkyl chain forms an alkyl substituent on the heterocyclic ring.

Unless stated otherwise, the following groups are more preferred groups within the general group definitions:

alkyl: linear and branched C1-C6-alkyl, long-chain alkyls: linear and branched C5-C10 alkyl, preferably C6-C8 alkyls alkenyl: C3-C6-alkenyl, cycloalkyl: C6-C8-cycloalkyl, alkoxy: C1-C4-alkoxy, long-chain alkoxy: linear and branched C5-C10 alkoxy, preferably linear C6-C8 alkoxy alkylene: selected from the group comprising: methylene; 1,2-ethylene; 1,3-propylene; butan-2-ol-1,4-diyl; 1,4-butylene; cyclohexane-1,1-diyl; cyclohexane-1,2-diyl; cyclohexane-1,4-diyl; cyclopentane-1,1-diyl; and cyclopentane-1,2-diyl, aryl: selected from the group comprising: phenyl; biphenyl; naphthalenyl; anthracenyl; and phenanthrenyl, arylene: selected from the group comprising: 1,2-phenylene; 1,3-phenylene; 1,4-phenylene; 1,2-naphthylene; 1,4-naphthalenylene; 2,3-naphthylene and 1-hydroxy-2,6-phenylene, heteroaryl: selected from the group comprising: pyridinyl; pyrimidinyl; quinoninyl; pyrazolyl; triazolyl; isoquinoninyl; imidazolyl; and oxazolidinyl, where the heteroaryl may be bonded to the compound by any atom in the ring of the selected heteroaryl, heteroarylene: selected from the group comprising: pyridine-2,3-diyl; pyridine-2,4-diyl; pyridine-2,6-diyl; pyridine-3,5-diyl; quinoline-2,3-diyl; quinoline-2,4-diyl; isoquinoline-1,3-diyl; isoquinoline-1,4-diyl; pyrazole-3,5-diyl; and imidazole-2,4-diyl, heterocycloalkyl: selected from the group comprising: pyrrolidinyl; morpholinyl; piperidinyl; piperidinyl; 1,4-piperazinyl; tetrahydrofuranyl; 1,4,7-triazacyclononanyl; 1,4,8,11-tetraazacyclotetradecanyl; 1,4,7,10,13-pentaazacyclo-pentadecanyl; 1,4,7,10-tetraazacyclododecanyl; and piperazinyl, where the heteroaryl may be bonded to the compound by any atom in the ring of the selected heteroaryl, heterocycloalkylene: selected from the group comprising: piperidin-2,6-ylene; piperidin-4,4-ylidene; 1,4-piperazin-1,4-ylene; 1,4-piperazin-2,3-ylene; 1,4-piperazin-2,6-ylene; tetrahydrothiophen-2,5-ylene; tetrahydrothiophen-3,4-ylene; tetrahydrofuran-2,5-ylene; tetrahydrofuran-3,4-ylene; pyrrolidin-2,5-ylene; pyrrolidin-2,2-ylidene; 1,4,7-triazacyclonon-1,4-ylene; 1,4,7-triazacyclonon-2,3-ylene; 1,4,7-triazacyclonon-2,2-ylidene; 1,4,8,11-tetraazacyclotetradec-1,4-ylene; 1,4,8,11-tetraazacyclotetradec-1,8-ylene; 1,4,8,11-tetraazacyclotetradec-2,3-ylene; 1,4,8,11-tetraazacyclotetra-dec-2,2-ylidene; 1,4,7,10-tetraazacyclododec-1,4-ylene; 1,4,7,10-tetraazacyclododec-1,7-ylene; 1,4,7,10-tetraazacyclododec-2,3-ylene; 1,4,7,10-tetraazacyclododec-2,2-ylidene; 1,4,7,10,13-pentaazacyclopentadec-1,4-ylene; 1,4,7,10,13-pentaazacyclopentadec-1,7-ylene; 1,4-diaza-7-thiacyclonon-1,4-ylene; 1,4-diaza-7-thiacyclonon-2,3-ylene; 1,4-diaza-7-thiacyclonon-2,2-ylidene; 1,4-diaza-7-oxacyclonon-1,4-ylene; 1,4-diaza-7-oxacyclonon-2,3-ylene; 1,4-diaza-7-oxacyclonon-2,2-ylidene; 1,4-dioxan-2,6-ylene; 1,4-dioxan-2,2-ylidene; tetrahydropyran-2,6-ylene; tetrahydropyran-2,5-ylene; and tetrahydropyran-2,2-ylidene, a —C1-C6-alkylheterocycloalkyl where the heterocycloalkyl is selected from the group comprising: piperidinyl; 1,4-piperazinyl; tetrahydrofuranyl; 1,4,7-triazacyclononanyl; 1,4,8,11-tetraazacyclotetradecanyl; 1,4,7,10,13-pentaazacyclopentadecanyl; 1,4,7,10-tetraazacyclo-dodecanyl; and pyrrolidinyl, where the heterocycloalkyl may be bonded to the compound by any atom in the ring of the selected heterocycloalkyl, amine: the —N(R)2 group where each R is independently selected from: hydrogen; C1-C6-alkyl; and benzyl, halogen: selected from the group comprising: F and Cl, carboxylate: the —C(O)OR group where R is selected from hydrogen; C1-C6-alkyl; and benzyl, carbonyl: the —C(O)R group where R is selected from: hydrogen; C1-C6-alkyl; benzyl and amines selected from the group of: —NR'2 where each R' is independently selected from:

hydrogen; C1-C6-alkyl; and benzyl.

In a preferred embodiment, $R^3$ is haloalkyl, more preferably perfluoroalkyl having 1 to 8 carbons, even more preferably 1 to 4, haloaryl, more preferably perfluoroaryl, haloalkylaryl, especially preferably (per)fluoroalkylaryl and haloheteroaryl, especially preferably perfluoroheteroaryl.

Further examples of ligands L preferably include fluorinated or nonfluorinated benzoic acids, for example 2-(trifluoromethyl)benzoic acid; 3,5-difluorobenzoic acid; 3-hydroxy-2,4,6-triiodobenzoic acid; 3-fluoro-4-methylbenzoic acid; 3-(trifluoromethoxy)benzoic acid; 4-(trifluoromethoxy)-benzoic acid; 4-chloro-2,5-difluorobenzoic acid; 2-chloro-4,5-difluorobenzoic acid; 2,4,5-trifluorobenzoic acid; 2-fluorobenzoic acid; 4-fluorobenzoic acid; 2,3,4-trifluorobenzoic acid; 2,3,5-trifluorobenzoic acid; 2,3-difluorobenzoic acid; 2,4-bis(trifluoromethyl)benzoic acid; 2,4-difluorobenzoic acid; 2,5-difluorobenzoic acid; 2,6-bis(trifluoromethyl)benzoic acid; 2,6-difluorobenzoic acid; 2-chloro-6-fluorobenzoic acid; 2-fluoro-4-(trifluoromethyl)-benzoic acid; 2-fluoro-5-(trifluoromethyl)benzoic acid; 2-fluoro-6-(trifluoromethyl)benzoic acid; 3,4,5-trifluorobenzoic acid; 3,4-difluorobenzoic acid; 3,5-bis(trifluoromethyl)benzoic acid; 3-(trifluoromethyl)benzoic acid; 3-chloro-4-fluorobenzoic acid; 3-fluoro-5-(trifluoromethyl)benzoic acid; 3-fluorobenzoic acid; 4-fluoro-2-(trifluoromethyl)benzoic acid; 4-fluoro-3-(trifluoromethyl)benzoic acid; 5-fluoro-2-methylbenzoic acid;

2-(trifluoromethoxy)benzoic acid; 2,3,5-trichlorobenzoic acid; 4-(trifluoromethyl)benzoic acid; pentafluorobenzoic acid; 2,3,4,5-tetrafluorobenzoic acid, fluorinated or non-fluorinated phenylacetic acid, for example 2-fluorophenylacetic acid; 3-fluorophenylacetic acid; 4-fluorophenylacetic acid; 2,3-difluorophenylacetic acid; 2,4-difluorophenylacetic acid; 2,6-difluorophenylacetic acid; 3,4-difluorophenylacetic acid; 3,5-difluorophenylacetic acid; pentafluorophenylacetic acid; 2-chloro-6-fluorophenylacetic acid; 2-chloro-3,6-difluorophenylacetic acid; 3-chloro-2,6-difluoro-phenylacetic acid; 3-chloro-4-fluorophenylacetic acid; 5-chloro-2-fluorophenylacetic acid; 2,3,4-trifluorophenylacetic acid; 2,3,5-trifluorophenylacetic acid; 2,3,6-trifluoro-phenylacetic acid; 2,4,5-trifluorophenylacetic acid; 2,4,6-trifluorophenylacetic acid; 3,4,5-trifluorophenylacetic acid; 3-chloro-2-fluorophenylacetic acid; α-fluorophenylacetic acid; 4-chloro-2-fluorophenylacetic acid; 2-chloro-4-fluorophenylacetic acid; α,α-difluorophenylacetic acid; ethyl 2,2-difluoro-2-phenylacetate; and fluorinated or non-fluorinated acetic acid, for example methyl trifluoroacetate; allyl trifluoroacetate; ethyl trifluoroacetate; isopropyl trifluoroacetate; 2,2,2-trifluoroethyl trifluoroacetate; difluoroacetic acid; trifluoroacetic acid; methyl chlorodifluoroacetate; ethyl bromodifluoroacetate; chlorodifluoroacetic acid; ethyl chlorofluoroacetate; ethyl difluoroacetate; (3-chlorophenyl)-difluoroacetic acid; (3,5-difluorophenyl)difluoroacetic acid; (4-butylphenyl)difluoroacetic acid; (4-tert-butylphenyl)-difluoroacetic acid; (3,4-dimethylphenyl)difluoroacetic acid; (3-chloro-4-fluorophenyl)difluoroacetic acid; (4-chlorophenyl)-difluoroacetic acid; 2-biphenyl-3',5'-difluoroacetic acid; 3-biphenyl-3',5'-difluoroacetic acid; 4-biphenyl-3',5'-difluoroacetic acid; 2-biphenyl-3',4'-difluoroacetic acid; 3-biphenyl-3',4'-difluoroacetic acid; 4-biphenyl-3',4'-difluoroacetic acid;

2,2-difluoropropionic acid, or higher homologs thereof. If the ligands L have acidic groups, the groups may, in a preferred embodiment, be in deprotonated form.

In an alternative preferred embodiment, $R^3$ is selected from the group comprising:

where $Y^1$-$Y^5$ are each independently selected from the group comprising C—F, C—CF$_3$, C—NO$_2$, C—CN, C-halogen, C-pseudohalogen and N.

In a preferred embodiment, $R^3$ is selected from the group comprising:

where $Y^1$-$Y^7$ are each independently selected from the group comprising C—F, C—CF$_3$, C—NO$_2$, C—CN, C-halogen, C-pseudohalogen and N.

In a preferred embodiment, $R^3$ is selected from the group comprising:

where $Y^1$-$Y^7$ are each independently selected from the group comprising C—F, CF$_3$, C—NO$_2$, C—CN, C-halogen, C-pseudohalogen and N.

In a preferred embodiment, $R^3$ is selected from the group comprising:

-continued

In a preferred embodiment, $R^3$ is selected from the group comprising halogenated, preferably perhalogenated and/or pseudohalogenated, pteridines, isopteridines, naphthyridines, quinoxalines, azaquinoxalines.

In a further preferred embodiment, the metal complex may contain at least one ligand L selected from the group of the unsubstituted, partly fluorinated or perfluorinated organic carboxylic acids. Organic carboxylic acids may generally be selected from the groups of the aliphatically, saturated monocarboxylic acids; aliphatically, unsaturated monocarboxylic acids; aliphatically, saturated dicarboxylic acids;
aliphatically, saturated tricarboxylic acids; aliphatically, unsaturated dicarboxylic acids; aromatic carboxylic acids; heterocyclic carboxylic acids; aliphatically, unsaturated cyclic monocarboxylic acids. Particularly preferred partial or perfluorinated ligands L are selected from substituted and unsubstituted compounds of acetic acid, phenylacetic acid and/or benzoic acid, and are listed by way of example above. Particular preference is given to non-fluorinated, partially fluorinated or perfluorinated acetic acid.

In a preferred embodiment, at least one of the ligands L is in a bridging arrangement between two metals.

In a preferred embodiment, the metal complex (in the absence of matrix material) is Lewis-acidic, meaning that it acts as an electron pair acceptor with respect to the hole conductor acting as matrix material. This has been found to be particularly preferred for interaction with the matrix materials.

In a preferred embodiment, the metal complex (in the absence of matrix material) has at least one unoccupied or partly accessible coordination site. This has likewise been found to be particularly preferred for interaction with the matrix materials.

In a preferred embodiment, the metal complex has the empirical formula $M_2L_n$ (with M=metal and L=ligand and n=3 or 4) where both the metals and the individual ligands may independently be selected as defined above.

In metal complexes of this structure, there is an M≡M multiple bond, which has been found to be particularly favorable for electrical and optical properties. Particular metal complexes of this type are also referred to as "paddle wheel" complexes—these are especially preferred.

In a further preferred embodiment, in the group of the molybdenum-containing metal complexes, particular preference is given to molybdenum paddle wheel metal complexes with oxygen/oxygen, oxygen/nitrogen or nitrogen/nitrogen bridging ligands. Additionally preferably, in the group of the molybdenum complexes, it is possible to use dinuclear molybdenum complexes $Mo_2^{4+}$ with a non-paddle-wheel structure but with metal-metal interactions. Further preferred ligands for the dinuclear molybdenum complexes $Mo_2^{4+}$ with a non-paddle-wheel structure may more preferably be selected, in addition to the ligands listed above, from the group of the halogens, water, hydrogen, alkoxides, polydentate chelating ligands and mixtures of these ligands.

In a further preferred embodiment, the metal complex may have a dinuclear paddle wheel structure and may contain chromium or molybdenum, and $R^1$ and $R^2$ may be oxygen. Metal complexes having a paddle wheel structure are known in the literature and are described, for example, in Cotton et al. "Multiple Bonds between Metal Atoms", Third Edition, 2005, ISBN 0-387-22605-2. A preferred paddle wheel structure is shown by way of example in the following diagram:

In a preferred embodiment, the matrix material of the organic electronic component comprises one or more of the following materials:
NPB (N,N'-bis(naphthalen-1-yl)-N,N'-bis(phenyl)benzidine)
β-NPB (N,N'-bis(naphthalen-2-yl)-N,N'-bis(phenyl)benzidine)
TPD (N,N'-bis(3-methylphenyl)-N,N'-bis(phenyl)benzidine)
spiro-TPD (N,N'-bis(3-methylphenyl)-N,N'-bis(phenyl)benzidine)
spiro-NPB (N,N'-bis(naphthalen-1-yl)-N,N'-bis(phenyl) spiro)
DMFL-TPD (N,N'-bis(3-methylphenyl)-N,N'-bis(phenyl)-9,9-dimethylfluorene)
DMFL-NPB (N,N'-bis(naphthalen-1-yl)-N,N'-bis(phenyl)-9,9-dimethylfluorene)
DPFL-TPD (N,N'-bis(3-methylphenyl)-N,N'-bis(phenyl)-9,9-diphenylfluorene)
DPFL-NPB (N,N'-bis(naphthalen-1-yl)-N,N'-bis(phenyl)-9,9-diphenylfluorene)
spiro-TAD (2,2',7,7'-tetrakis(N,N-diphenylamino)-9,9'-spirobi-fluorene)
9,9-bis[4-(N,N-bis(biphenyl-4-yl)amino)phenyl]-9H-fluorene
9,9-bis[4-(N,N-bis(naphthalen-2-yl)amino)phenyl]-9H-fluorene
9,9-bis[4-(N,N'-bis(naphthalen-2-yl)-N,N'-bisphenylamino)-phenyl]-9H-fluorene
N,N'-bis(phenanthren-9-yl)-N,N'-bis(phenyl)benzidine
2,7-bis[N,N-bis(9,9-spiro-bifluoren-2-yl)amino]-9,9-spiro-bifluorene
2,2'-bis[N,N-bis(biphenyl-4-yl)amino]-9,9-spirobifluorene
2,2'-bis(N,N-diphenylamino)-9,9-spirobifluorene
di[4-(N,N-ditolylamino)phenyl]cyclohexane
2,2',7,7'-tetra(N,N-ditolylamino)spirobifluorene
N,N,N',N'-tetranaphthalen-2-ylbenzidine These materials have been found to be useful as hole-conducting matrix materials in organic electronic components.

In a preferred embodiment, the doping level in mol of metal complex based on mol of matrix material is from ≥0.1% to ≤50%. This has been found to be appropriate to the purpose. Preferably, the doping level is from ≥0.5% to ≤15%, more preferably ≥1% to ≤5%.

The inventors also propose uses for a bi- or polynuclear group Vb/VIb/VIIb or group 5-7 metal complex containing at least one ligand L of the following structure:

where $R^1$ and $R^2$ are each independently oxygen, sulfur, selenium, NH or $NR^4$ where $R^4$ is selected from the group comprising alkyl and aryl and may be bonded to $R^3$; and $R^3$ is selected from the group comprising alkyl, long-chain alkyl, alkoxy, long-chain alkoxy, cycloalkyl, haloalkyl, aryl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl, where one or more non-adjacent $CH_2$ groups in suitable radicals may independently be replaced by —O—, —S—, —NH—, —NR°—, —SiR°R°°—, —CO—, —COO—, —$SO_2$—, —S—CO—, —CO—S—, —CY1=CY2 or —C≡C—, in such a way that no oxygen and/or sulfur atoms are bonded directly to one another, and are likewise optionally replaced by aryl or heteroaryl preferably containing 1 to 30 carbon atoms (terminal $CH_3$ groups are regarded as $CH_2$ groups in the sense of $CH_2$—H). as a p-dopant for matrix materials of electronic components.

The aforementioned components, and also those described in the working examples, are not subject to any particular exceptional conditions in terms of their size, configuration, materials selection and technical design, and so the selection criteria known in the field of use can be applied without limitation.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

Example I

Example I relates to $Cr_2(O_2CCF_3)_4(Et_2O)_2$ which has been prepared as follows:
Synthesis of $K_4Cr_2(CO_3)_4$ The $K_4Cr_2(CO_3)_4$ precursor was prepared as follows: Cr metal (2.5 g; 48.1 mmol) was charged in a Schlenk vessel, 20 mL of oxygen-free water added under an argon stream. HCl (8 mL; 82.5 mmol) were added dropwise thereto. The solution instantly turned deep blue. It was then filtered through Celite in order to remove excess chromium.

20 mL of an aqueous $K_2CO_3$ solution (12 g; 87.0 mmol), through which an argon stream had been blown for one hour, was added to the blue $CrCl_2$ solution, whereupon an orange/red solid precipitated out, which was filtered, washed three times with diethyl ether and then dried under reduced pressure. Yield: 94%.
Synthesis of $Cr_2(O_2CCF_3)_4(Et_2O)_x$ (X<2)

$K_4Cr_2(CO_3)_4$ (4 g; 8.0 mmol) and trifluoroacetic acid (3 mL; 38.9 mmol) were heated at reflux in diethyl ether for 6 h. In this period, the orange solution became deep blue after about one hour. After filtering, the solvent was removed and dried under reduced pressure to constant weight. This gave a violet powder. Yield: 86%.

The product was purified further by sublimation.
Vaporization

ITO-prestructured glass substrates were subjected to an oxygen plasma treatment for 10 min and then subsequently transferred as quickly as possible to the vaporizer. The vaporizer was transferred into an argon glovebox in which the oxygen and water concentration was less than 2 ppm.

All the vaporizations were conducted at a vacuum of less than $2\times10^{-6}$ mbar base pressure (the pressure then rises in the course of vaporization).

First of all, both the matrix material and doping material were heated to just below the vaporization point, then heating was continued until constant vaporization was observable.

The overall vaporization rate was about 1 Å/s, with the vaporization rate of the doping material set via the vaporization rate of the matrix material.

Once the shutters had been closed, the system was cooled to 40° C. and evacuated with argon and the mask for the deposition of the cathode was changed.

The electrode is formed of a 150 nm-thick aluminum layer, which was applied at an initial vaporization rate of 0.5 Å/s, which was increased gradually to 5 Å/s.

FIGS. 4 to 7 relate to $Cr_2(O_2CCF_3)_4(Et_2O)_x$-doped (with x<2) and undoped NPB(=bis-N,N,N',N'-(naphthylphenyl) benzidine). In these cases, 200 nm-thick layers of NPB on the one hand, and of NPB doped with 2% $Cr_2(O_2CCF_3)_4$ $(Et_2O)_x$, 5% $Cr_2(O_2CCF_3)_4(Et_2O)_x$ and 10% $Cr_2(O_2CCF_3)_4$ $(Et_2O)_x$ on the other hand, were produced.

Figure 4:
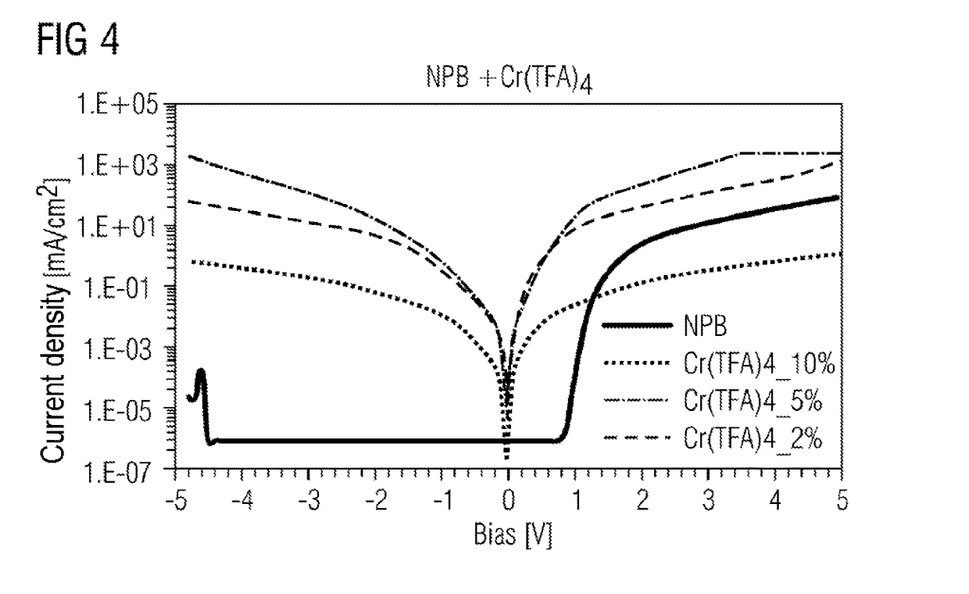
FIG. 4 is a graph of current density against voltage for an undoped matrix material and for a plurality of doped matrix materials in a first embodiment.
Figure 5:
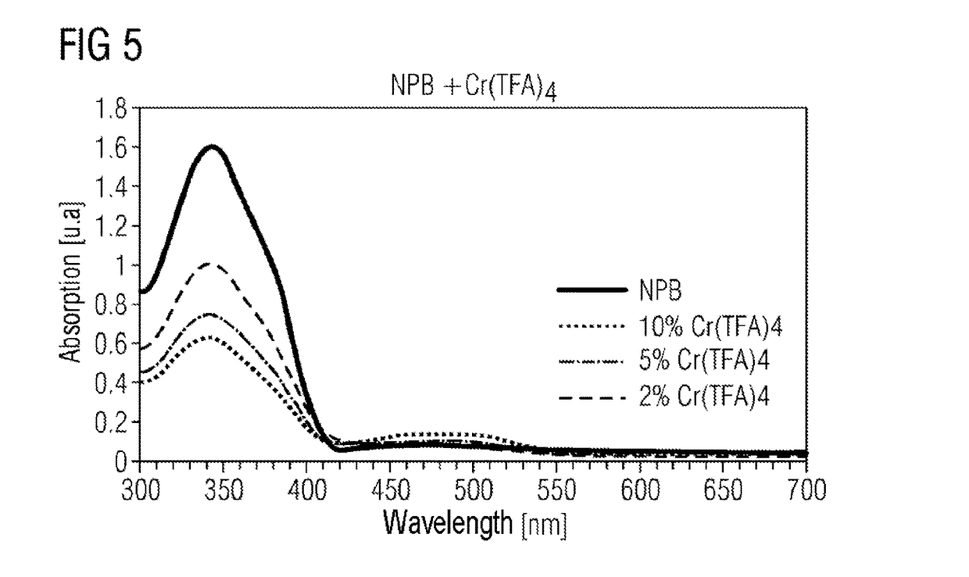
FIG. 5 is a graph of absorption against wavelength for the materials from FIG. 4.
Figure 6:
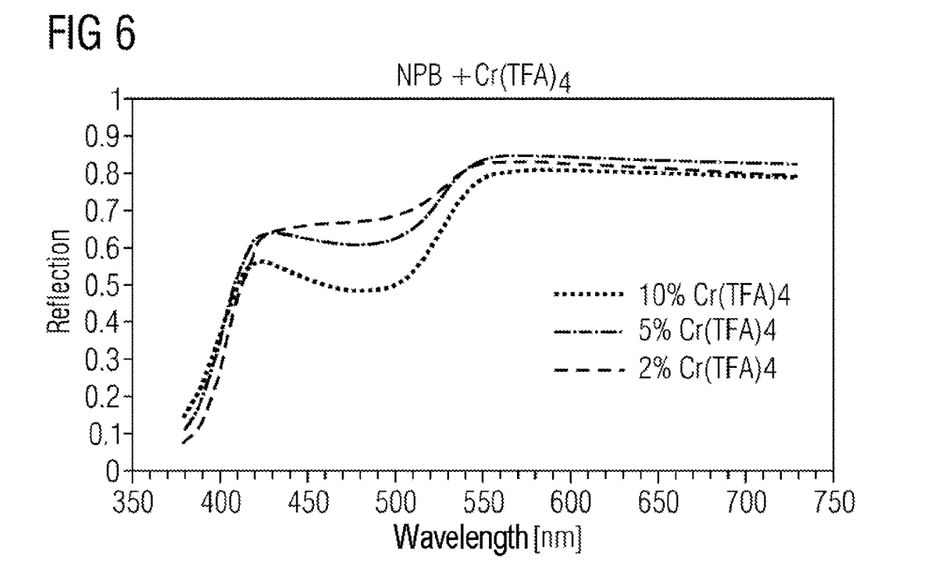
FIG. 6 is a graph of reflection against wavelength for the doped materials from FIG. 4.
Figure 7:
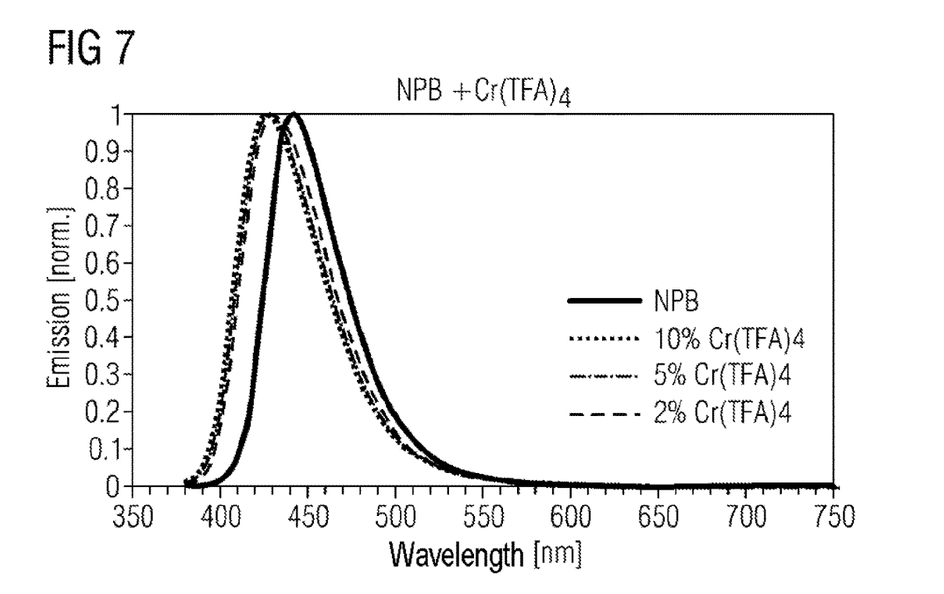
FIG. 7 is a graph of normalized emission against wavelength for the doped materials from FIG. 4.

FIG. 4 shows current density against voltage applied for the four materials. Even in the case of the 2% doped layer, an increase in current density against voltage applied is observed.

To study the optical properties of the dopant material, absorption, reflection and normalized emission were measured (FIGS. 4 to 7). It can be seen that the complexes are virtually transparent, which makes them suitable for use in (opto)electronic components.

Example II

Example II relates to $Mo_2(O_2CCF_3)_4$, which was prepared according to F. A. Cotton and J. G. Norman, Jr. Coord. Chem, 1971, 1, 161.

In analogy to example I, three layers, one of an undoped matrix material (HTM-014, Merck), and one HTM-014 layer doped with 5% and 15% $Mo_2(O_2CCF_3)_4$, were applied. The layer thickness was 200 nm in each case.

Figure 8:
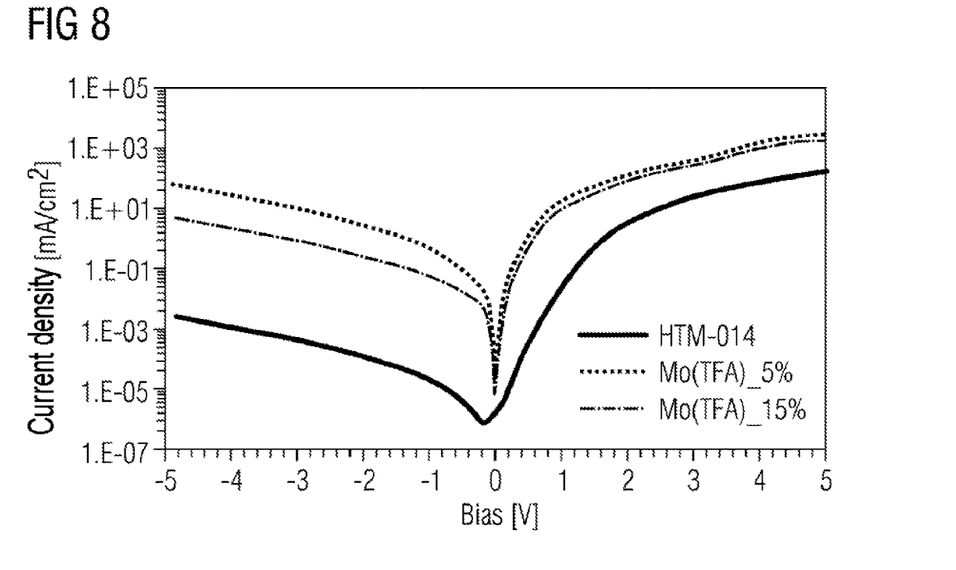
FIG. 8 is a graph of current density against voltage for an undoped matrix material and for several doped matrix materials in a second embodiment.

FIG. 8 shows current density against voltage applied for the three materials. Even in the case of the layer with 5% doping, an increase in current density against voltage applied is observed.

Figure 9:
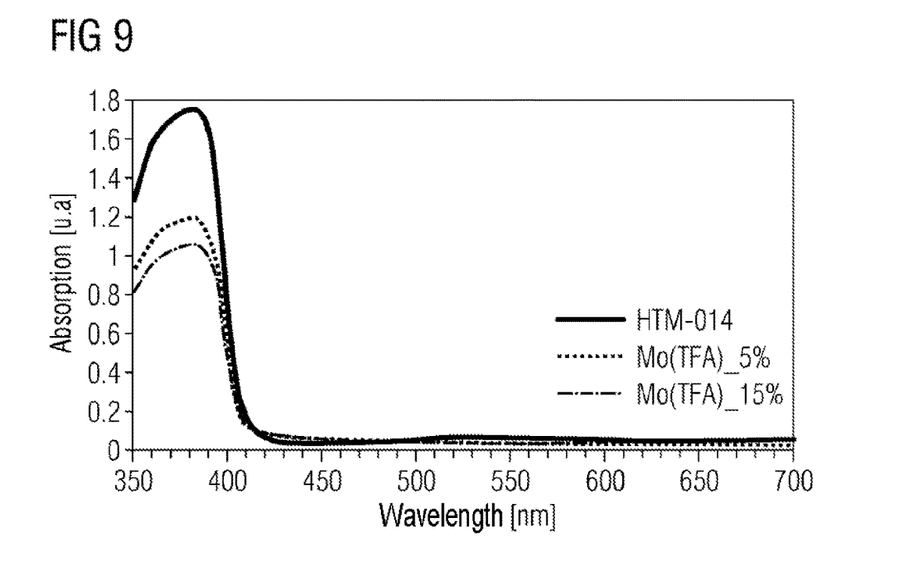
FIG. 9 is a graph of absorption against wavelength for the materials from FIG. 8.
Figure 10:
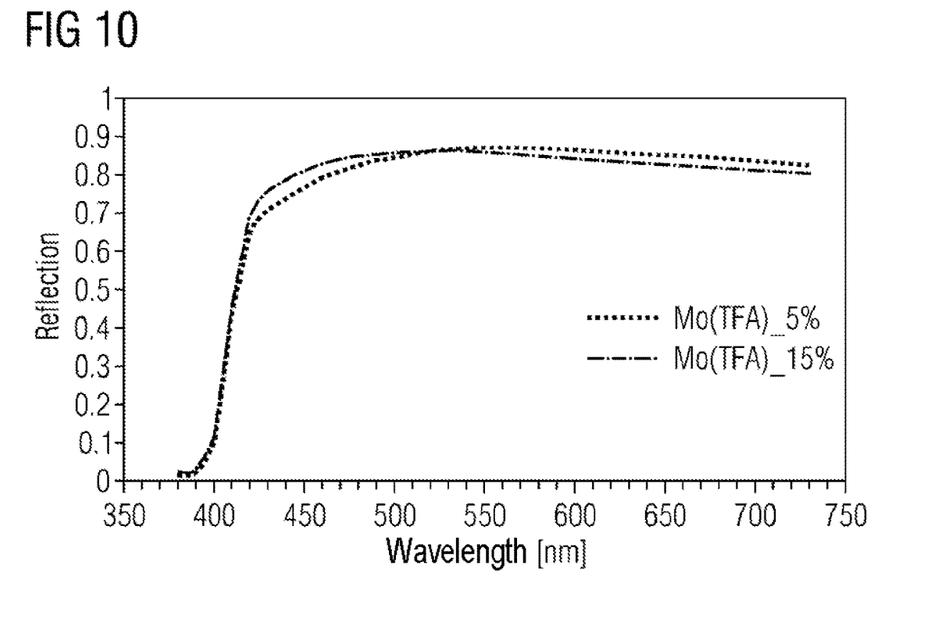
FIG. 10 is a graph of reflection against wavelength for the doped materials from FIG. 8.
Figure 11:
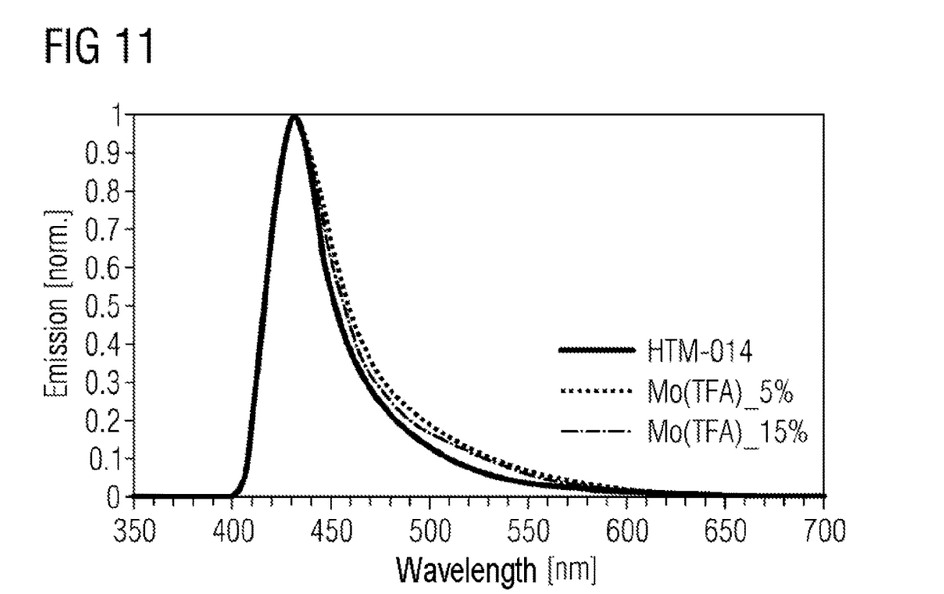
FIG. 11 is a graph of normalized emission against wavelength for the materials from FIG. 8.

To study the optical properties of the dopant material, absorption, reflection and normalized emission were measured (FIGS. 9 to 11). It can be seen that the complexes are virtually transparent, which makes them suitable for use in (opto)electronic components.

The individual combinations of the constituents and of the features of the executions already mentioned are illustrative; the exchange and the substitution of these teachings for other teachings present in this publication are likewise explicitly contemplated with the publications cited. It will be apparent to the person skilled in the art that variations, modifications and other executions which are described here can likewise occur, without departing from the idea and the scope.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. An organic electronic component comprising:
   a matrix containing a p-dopant, the p-dopant being a bi- or polynuclear group metal complex containing at least two metal atoms selected from groups Vb/VIb/VIIb, IUPAC groups 5-7, which groups consist of vanadium, niobium, tantalum (group 5), chromium, molybdenum, tungsten (group 6), manganese, technetium, rhenium (group 7), and mixtures thereof, the metal complex having a neutral charge and containing at least one ligand L of the following structure:

where $R^1$ and $R^2$ each independently represents oxygen, sulfur, selenium, NH or $NR^4$ where $R^4$ is an alkyl or aryl group and may be bonded to $R^3$; and where $R^3$ is selected from the group consisting of alkyl groups, long-chain alkyl groups, alkoxy groups, long-chain alkoxy groups, cycloalkyl groups, haloalkyl groups, aryl groups, arylenes, haloaryl groups, heteroaryl groups, heteroarylenes, heterocycloalkylenes, heterocycloalkyl groups, haloheteroaryl groups, alkenyl groups, haloalkenyl groups, alkynyl groups, haloalkynyl groups, ketoaryl groups, haloketoaryl groups, ketoheteroaryl groups, ketoalkyl groups, haloketoalkyl groups, ketoalkenyl groups, haloketoalkenyl groups, where one or more non-adjacent CH2 groups in suitable radicals may independently be replaced by:

—O—, —S—, —NH—, —NR°—, —SiR°R°°—, —CO—, —COO—, —OCO—, —OCO—O—, —SO₂—, —S—CO—, —CO—S, —CY1=CY2 or —C≡C—, in such a way that no oxygen and/or sulfur atoms are bonded directly to one another, or an aryl group or heteroaryl group containing 1 to 30 carbon atoms in which terminal $CH_3$ groups are regarded as $CH_2$ groups, $CH_2$—H.

2. The component as claimed in claim 1, wherein the metal atoms are selected from the group consisting of chromium, molybdenum, tungsten and mixtures of chromium, molybdenum and/or tungsten.

3. The component as claimed in claim 1, wherein R3 is selected from the group consisting of haloalkyl groups, haloaryl groups, haloalkylaryl groups and haloheteroaryl groups.

4. The component as claimed in claim 1, wherein $R^3$ is represented by the following formula:

where $Y^1$-$Y^5$ are each independently selected from the group consisting of C—F, C—$CF_3$, C—$NO_2$, C—CN, C-halogen, C-pseudohalogen and N.

5. The component as claimed in claim 1, wherein the metal complex further contains at least one ligand selected from the group consisting of the unsubstituted organic carboxylic acids, partially fluorinated organic carboxylic acids and perfluorinated organic carboxylic acids.

6. The component as claimed in claim 1, wherein the metal complex further contains at least one ligand selected from the group consisting of unsubstituted acetic acid, partially fluorinated acetic acids and perfluorinated acetic acids.

7. The component as claimed in claim 1, wherein the metal complex has a paddle wheel structure and contains chromium or molybdenum as the metal atoms and wherein $R^1$ and $R^2$ are oxygen.

8. The component as claimed in claim 1, wherein the metal complex has a paddle wheel structure represented by the following formula:

where the metal atoms M are chromium or molybdenum and $R^1$ and $R^2$ are oxygen.

9. A method comprising:
using a matrix material as a component of an electronic device, the matrix material containing a p-dopant, the p-dopant being a bi- or polynuclear group metal complex containing at least two metal atoms selected from groups Vb/VIb/VIIb, IUPAC groups 5-7, which groups consist of vanadium, niobium, tantalum (group 5), chromium, molybdenum, tungsten (group 6), manganese, technetium, rhenium (group 7), and mixtures thereof, the metal complex having a neutral charge and containing at least one ligand L of the following structure:

where $R^1$ and $R^2$ each independently represents oxygen, sulfur, selenium, NH or $NR^4$ where $R^4$ is an alkyl or aryl group and may be bonded to $R^3$; and
where $R^3$ is selected from the group consisting of alkyl groups, long-chain alkyl groups, alkoxy groups, long-chain alkoxy groups, cycloalkyl groups, haloalkyl groups, aryl groups, arylenes, haloaryl groups, heteroaryl groups, heteroarylenes, heterocycloalkylenes, heterocycloalkyl groups, haloheteroaryl groups, alkenyl groups, haloalkenyl groups, alkynyl groups, haloalkynyl groups, ketoaryl groups, haloketoaryl groups, ketoheteroaryl groups, ketoalkyl groups, haloketoalkyl groups, ketoalkenyl groups, haloketoalkenyl groups, where one or more non-adjacent CH2 groups in suitable radicals may independently be replaced by:
—O—, —S—, —NH—, —NR°—, —SiR°R°°—, —CO—, —COO—, —OCO—, —OCO—O—, —SO$_2$, —S—CO—, —CO—S, —CY1=CY2 or —C≡C—, in such a way that no oxygen and/or sulfur atoms are bonded directly to one another, or
an aryl group or a heteroaryl group containing 1 to 30 carbon atoms in which terminal CH$_3$ groups are regarded as CH$_2$ groups, CH$_2$—H.

10. The method as claimed in claim 9, wherein the electronic device is an organic light emitting diode, and the matrix material is used as a hole transport layer in the organic light emitting diode.

11. The method as claimed in claim 9, wherein the electronic device is a solar cell, and the matrix material is used as a p-doped layer in the solar cell.

12. The method as claimed in claim 9, wherein the electronic device is an organic field effect transistor, and
the matrix material is used as an organic semiconductor layer in the organic field effect transistor.

13. A method comprising:
preparing a matrix material containing a p-dopant by a process including a vaporization step using an oxygen concentration of less than 2 ppm;
wherein the p-dopant is a bi- or polynuclear group metal complex containing at least two metal atoms selected from groups Vb/VIb/VIIb, IUPAC groups 5-7, which groups consist of vanadium, niobium, tantalum (group 5), chromium, molybdenum, tungsten (group 6), manganese, technetium, rhenium (group 7), and mixtures thereof, the metal complex containing at least one ligand L of the following structure:

where $R^1$ and $R^2$ each independently represents oxygen, sulfur, selenium, NH or $NR^4$ where $R^4$ is an alkyl or aryl group and may be bonded to $R^3$; and
where $R^3$ is selected from the group consisting of alkyl groups, long-chain alkyl groups, alkoxy groups, long-chain alkoxy groups, cycloalkyl groups, haloalkyl groups, aryl groups, arylenes, haloaryl groups, heteroaryl groups, heteroarylenes, heterocycloalkylenes, heterocycloalkyl groups, haloheteroaryl groups, alkenyl groups, haloalkenyl groups, alkynyl groups, haloalkynyl groups, ketoaryl groups, haloketoaryl groups, ketoheteroaryl groups, ketoalkyl groups, haloketoalkyl groups, ketoalkenyl groups, haloketoalkenyl groups, where one or more non-adjacent CH2 groups in suitable radicals may independently be replaced by:
—O—, —S—, —NH—, —NR°—, —SiR°R°°—, —CO—, —COO—, —OCO—, —OCO—O—, —SO$_2$, —S—CO—, —CO—S, —CY1=CY2 or —C≡C—, in such a way that no oxygen and/or sulfur atoms are bonded directly to one another, or
an aryl group or a heteroaryl group containing 1 to 30 carbon atoms in which terminal CH$_3$ groups are regarded as CH$_2$ groups, CH$_2$—H; and
using the matrix material as a component of an electronic device.

14. The component as claimed in claim 1, wherein R3 is represented by the following formula:

where $Y^1$—$Y^7$ are each independently selected from the group consisting of C-F, C-CF$_3$, C-NO$_2$, C-CN, C-halogen, C-pseudohalogen and N.

15. The component as claimed in claim 1, wherein R3 is represented by the following formula:

where $Y^1$—$Y^7$ are each independently selected from the group consisting of C-F, $CF_3$, $C-NO_2$, C-CN, C-halogens, C-pseudohalogens and N.

* * * * *